United States Patent
Na et al.

(10) Patent No.: US 11,017,877 B2
(45) Date of Patent: May 25, 2021

(54) MULTI-CHIP PACKAGE

(71) Applicant: Samsung Electronics Co., Ltd., Suwon-si (KR)

(72) Inventors: Dae Hoon Na, Seoul (KR); Jang Woo Lee, Seoul (KR); Jin Do Byun, Suwon-si (KR); Jeong Don Ihm, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/537,970

(22) Filed: Aug. 12, 2019

(65) Prior Publication Data
US 2020/0227131 A1    Jul. 16, 2020

(30) Foreign Application Priority Data

Jan. 11, 2019    (KR) ........................ 10-2019-0003644

(51) Int. Cl.
| | | |
|---|---|---|
| G11C 29/00 | (2006.01) | |
| G11C 29/50 | (2006.01) | |
| H01L 25/065 | (2006.01) | |
| H01L 25/18 | (2006.01) | |

(52) U.S. Cl.
CPC .... *G11C 29/50004* (2013.01); *H01L 25/0652* (2013.01); *H01L 25/18* (2013.01); *G11C 2029/5004* (2013.01); *G11C 2029/5006* (2013.01); *H01L 2225/06506* (2013.01); *H01L 2225/06562* (2013.01); *H01L 2225/06586* (2013.01)

(58) Field of Classification Search
CPC ...... G11C 29/50004; G11C 2029/5006; G11C 2029/5004; H01L 25/0652; H01L 25/18; H01L 2225/06562; H01L 2225/06586
See application file for complete search history.

(56) References Cited

U.S. PATENT DOCUMENTS

| | | |
|---|---|---|
| 5,918,107 A | 6/1999 | Fogal et al. |
| 6,728,653 B1 | 4/2004 | Figueredo |
| 6,891,384 B2 | 5/2005 | Mardi et al. |
| 6,900,628 B2 | 5/2005 | Shirahama et al. |
| 7,755,083 B2 | 7/2010 | Lin |

(Continued)

FOREIGN PATENT DOCUMENTS

KR    20070109434 A    11/2007

*Primary Examiner* — Samir W Rizk
(74) *Attorney, Agent, or Firm* — Harness, Dickey & Pierce, P.L.C.

(57) ABSTRACT

Provided are multi-chip packages. A multi-chip package includes a first memory chip and a second memory chip on a printed circuit board; a memory controller electrically connected to the first memory chip and the second memory chip via a first bonding wire and a second bonding wire; and a strength control module configured to control a drive strength of each of a first output driver of the first memory chip and a second output driver of the second memory chip, wherein the memory controller includes an interface circuit configured to receive each of first test data and second test data from the first output driver and the second output driver in which the drive strength is set by the strength control module, and output detection data for detecting whether the first bonding wire and the bonding wire are short-circuited based on the first and second test data.

20 Claims, 15 Drawing Sheets

(56) References Cited

U.S. PATENT DOCUMENTS

| | | |
|---|---|---|
| 9,082,333 B2 | 7/2015 | Hwang et al. |
| 9,978,712 B2 | 5/2018 | Zhu et al. |
| 2018/0158799 A1 | 6/2018 | Na et al. |
| 2019/0120897 A1* | 4/2019 | Meyer ............ G01R 31/318569 |

* cited by examiner

FIG. 8

TABLE 1

| CASE | CHANNEL | DRIVER STRENGTH | DATA | OUTPUT | |
|---|---|---|---|---|---|
| | | | | NORMAL | SHORT |
| 1 | #0 | WEAK | H | H | L |
| | #1 | STRONG | L | | |
| 2 | #0 | STRONG | L | H | L |
| | #1 | WEAK | H | | |

MULTI-CHIP PACKAGE

CROSS-REFERENCE TO RELATED APPLICATION

This application claims priority from Korean Patent Application No. 10-2019-0003644 filed on Jan. 11, 2019 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a multi-chip package.

2. Description of the Related Art

A plurality of semiconductor chips are mounted inside a multi-chip package. The plurality of semiconductor chips mounted inside the multi-chip package is electrically connected to each other via bonding wires inside the multi-chip package. Here, when the multi-chip package corresponds to a memory system such as an embedded multimedia card (eMMC) system and a universal flash storage (UFS) system, the plurality of semiconductor chips may include a plurality of (nonvolatile) memory chips that stores data, and a memory controller that controls and accesses the plurality of memory chips.

The bonding wires between the memory controller and the plurality of memory chips are not directly connected to an external terminal of the multi-chip package. Therefore, in the case of a defect such as a short of two bonding wires or a defect in which an open channel is formed between the memory controller and the memory chip occurs, it is difficult to detect the defect only with the signal applied to the external terminal.

SUMMARY

Aspects of the present disclosure provide a multi-chip package for accurately detecting defects such as short-circuit and open which may occur inside the multi-chip package.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present disclosure, there is provided a multi-chip package including: a first memory chip and a second memory chip on a printed circuit board; a memory controller electrically connected to the first memory chip and the second memory chip via a first bonding wire and a second bonding wire; and a strength control module configured to control a drive strength of each of a first output driver of the first memory chip and a second output driver of the second memory chip, wherein the memory controller includes an interface circuit configured to receive each of first test data and second test data from the first output driver and the second output driver in which the drive strength is set by the strength control module, and output detection data for detecting whether the first bonding wire and the bonding wire are short-circuited based on the first and second test data.

According to another aspect of the present disclosure, there is provided a multi-chip package including: a memory chip on a printed circuit board; a memory controller electrically connected to the memory chip through a bonding wire and including an interface circuit for driving the memory chip; and a strength control module configured to respectively control drive strengths of output drivers of the memory chip and the interface circuit, wherein the interface circuit is configured to output, using the output drivers of the memory chip and the interface circuit, detection data for detecting whether an open channel between the memory chip and the interface circuit exists.

According to still another aspect of the present disclosure, there is provided a multi-chip package including: a memory chip on a printed circuit board; and a memory controller electrically connected to the memory chip through a bonding wire and includes an interface circuit configured to drive the memory chip, wherein the interface circuit includes a first drive transistor configured to provide a power supply voltage to the memory chip, and a second drive transistor configured to provide a ground voltage to the memory chip, and the interface circuit configured to detect, using the first drive transistor and the second drive transistor, whether a channel between the memory chip and the memory controller is opened.

BRIEF DESCRIPTION OF THE DRAWINGS

The above and other aspects and features of the present disclosure will become more apparent by describing in detail example embodiments thereof with reference to the attached drawings, in which:

FIG. 8 is a table illustrating the operation of the multi-chip package of FIG. 1;

DETAILED DESCRIPTION OF THE EMBODIMENTS

Hereinafter, example embodiments of the present disclosure will be described with reference to the accompanying drawings. However, those having ordinary skill in the technical field to which the present disclosure belongs will appreciate that the present disclosure may be implemented in other specific forms without changing the technical ideas or essential features thereof. It is therefore to be understood that the example embodiments described below are illustrative rather than restrictive in all respects.

Figure 1:
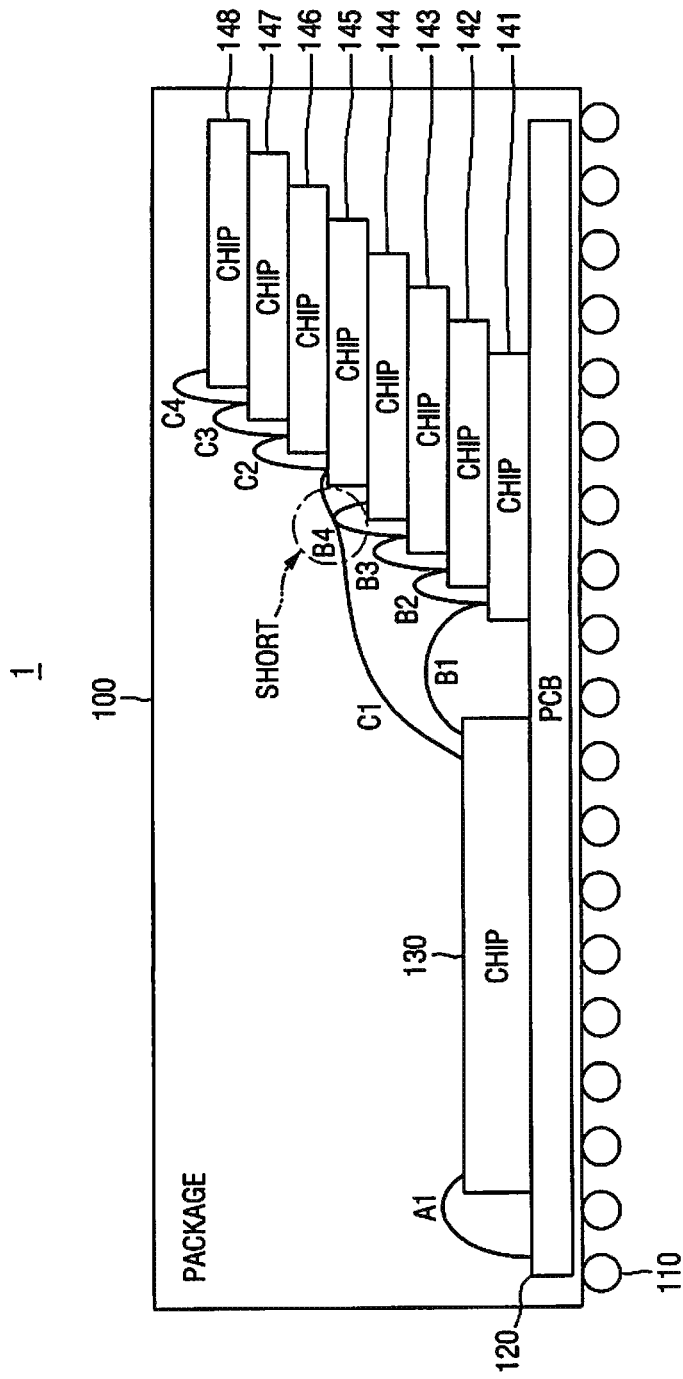
FIG. 1 is a cross-sectional view illustrating a multi-chip package according to an example embodiment of the present disclosure.

FIG. 1 is a cross-sectional view illustrating a multi-chip package according to an example embodiment of the present disclosure.

Referring to FIG. 1, the multi-chip package 1 includes a package 100 and an external terminal 110. Further, the package 100 includes a semiconductor chip 130 and a plurality of semiconductor chips 141 to 148 mounted on the printed circuit board 120.

It will be understood that, as described herein, an element that is "on" another element may be "above" or "below" the other element. Additionally, it will be understood that, as described herein, an element that is "on" another element may be directly on the other element, such that the elements are in direct contact with each other, or may be indirectly on the other elements, such that the elements are isolated from direct contact with each other by one or more interposing structures and/or spaces.

Here, the multi-chip package 1 may be a memory system that provides a large-capacity and high-speed memory device. For example, the multi-chip package 1 may be an embedded multi media card (eMMC system) or a universal flash storage (UFS) system which includes a NAND type flash-based nonvolatile memory device, that is, a plurality of semiconductor chips 141 to 148, and includes a memory controller for controlling the nonvolatile memory device, that is, a semiconductor chip 130.

In this specification, for the sake of convenience of explanation, assuming that the multi-chip package 1 is implemented as such a memory system, the semiconductor chip 130 will be described as a memory controller 130, and the plurality of semiconductor chips 141 to 148 will be described as a plurality of memory chips 141 to 148. However, the scope of the present disclosure is not limited thereto, and the semiconductor chips 130 and the plurality of semiconductor chips 141 to 148 may be implemented as a chip including an arbitrary semiconductor circuit.

On the other hand, in some example embodiments of the present disclosure, the multi-chip package 1 may be implemented as packages such as a PoP (Package On Package), a BGA (Ball Grid Arrays), a CSP (Chip Scale Package), a PLCC (Plastic Leaded Chip Carrier), a PDIP (Plastic Dual In-line Package), Die in Waffle Pack, Die in Wafer Form, a COB (Chip On Board), a CERDIP (CERamic Dual In-line Package), a MQFP (Metal Quad Flat Package), a TQFP (Thin Quad FlatPack), Small Outline (SOIC), a SSOP (Shrink Small Outline Package), a TSOP (Thin Small Outline), a SIP (System In Package), a MCP (multi-chip Package), a WFP (Wafer-level Fabricated Package), and a WSP (Wafer-level process Stack Package), but the scope of the present disclosure is not limited thereto.

As described above, the package 100 may include a memory controller 130 and a plurality of memory chips 141 to 148. In some example embodiments, the memory controller 130 may include hardware such as logic circuits; a hardware/software combination, such as a processor executing software; or a combination thereof. For example, a processor may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

In the present example embodiment, the external terminal 110 may be implemented as a plurality of package balls, but the scope of the present disclosure is not limited thereto.

In the present example embodiment, the printed circuit board 120 may include a plurality of conductive layers and a through electrode (through-silicon vias: TSV) separated by an insulating layer therein. The conductive layer and the through electrode of the printed circuit board 120 may be electrically connected to the external terminal 110 of the multi-chip package 1.

The memory controller 130 may be electrically connected to the external terminal 110 of the multi-chip package 1 via the bonding wire A1. The bonding wire A1 may be connected between a pad of the through electrode of the printed circuit board 120 connected to the external terminal 110 and a pad of the memory controller 130. In some example embodiments of the present disclosure, the bonding wire A1 may be connected between the pad, to which the conductive layer of the printed circuit board 120 connected to the external terminal 110 is connected, and the pad of the memory controller 130.

Each of the plurality of memory chips 141 to 148 may include a nonvolatile memory device. The nonvolatile memory device may include nonvolatile memory element such as a NAND type flash memory, a NOR type flash memory, a phase change memory (PRAM), a resistance memory (ReRAM), and a magnetoresistive memory (MRAM). For convenience of explanation, the nonvolatile memory device is described on the basis of NAND type flash memory in this specification.

The nonvolatile memory device includes a memory cell array including a plurality of memory cells constituted by a plurality of rows corresponding to word lines and a plurality of columns corresponding to bit lines. Each memory cell may store 1-bit data or M-bit data (here, M is an integer of 2 or more). Each memory cell may be implemented as a memory cell having a charge storage layer such as a floating gate or a charge trap layer, or a memory cell having a variable resistance element or the like.

The memory cell array may be implemented in a single-layer array structure or a two-dimensional array structure, or may be implemented in a multi-layer array structure or a three-dimensional array structure. In some example embodiments of the present disclosure, the three-dimensional array structure may include NAND strings disposed vertically such that at least one memory cell is located above another memory cell.

The nonvolatile memory devices of the plurality of memory chips 141 to 148 may constitute a single channel controlled by the memory controller 130. In some example embodiments of the present disclosure, nonvolatile memory devices operating independently of each other may constitute a single channel. For example, the plurality of memory chips 141 to 144 may constitute a first channel, and the plurality of memory chips 145 to 148 may constitute a second channel.

The plurality of memory chips 141 to 144 may be electrically connected to the memory controller 130 via the bonding wires B1 to B4. The bonding wires B1 to B4 may transmit commands, addresses and data, which are provided from the memory controller 130, to the plurality of memory chips 141 to 144. The bonding wires B1 to B4 may constitute signal lines of the channel.

For example, the bonding wire B1 may be connected between the memory controller 130 and the memory chip 141, the bonding wire B2 may be connected between the memory chip 141 and the memory chip 142, the bonding wire B3 may be connected between the memory chip 142 and the memory chip 143, and the bonding wire B4 may be connected between the memory chip 143 and the memory chip 144.

The plurality of memory chips 145 to 148 may be electrically connected to the memory controller 130 via the bonding wires C1 to C4. The bonding wires C1 to C4 may transmit commands, addresses and data, which are provided from the memory controller 130, to the plurality of memory chips 145 to 148. The bonding wires C1 to C4 may constitute the signal lines of the channel.

For example, the bonding wire C1 may be connected between the memory controller 130 and the memory chip 145, the bonding wire C2 may be connected between the memory chip 145 and the memory chip 146, the bonding wire C3 may be connected between the memory chip 146 and the memory chip 147, and the bonding wire C4 may be connected between the memory chip 147 and the memory chip 148.

The bonding wires (B1 to B4 and C1 to C4) between the memory controller 130 and the plurality of memory chips 141 to 148 are not directly connected to the external terminal 110 of the multi-chip package 1. However, defects may occur in the manufacturing process of the multi-chip package 1.

As an example of the defects, two or more bonding wires B4 and C1 may be short-circuited. The bonding wire used for the multi-chip package 1 has a fine thickness and is made of a metal such as gold, but it is not separately provided with an insulating coating. Therefore, after the printed circuit board 120, the memory controller 130, the plurality of memory chips 141 to 148, and the like are all mounted on the multi-chip package 1, and the bonding wires (B1 to B4 and C1 to C4) are connected, in the course of filling the material for filling the package 100A, short-circuit may occur between the bonding wires (B1 to B4 and C1 to C4).

As another example of the defects, while some of the bonding wires (B1 to B4 and C1 to C4) connected to the memory controller 130 or the plurality of memory chips 141 to 148 in the manufacturing process are detached from the memory controller 130 or the plurality of memory chips 141 to 148, an open channel between the memory controller 130 and the memory chips 141 to 148 may occur.

However, since the bonding wires (B1 to B4 and C1 to C4) are not directly connected to the external terminal 110 of the multi-chip package 1, it is difficult to detect defects occurring in the multi-chip package 1 only with the signal applied to the external terminal 110. Hereinafter, various example embodiments of the present disclosure for accurately detecting defects such as short-circuit and open which may occur inside the multi-chip package 1 will be described.

Figure 2:
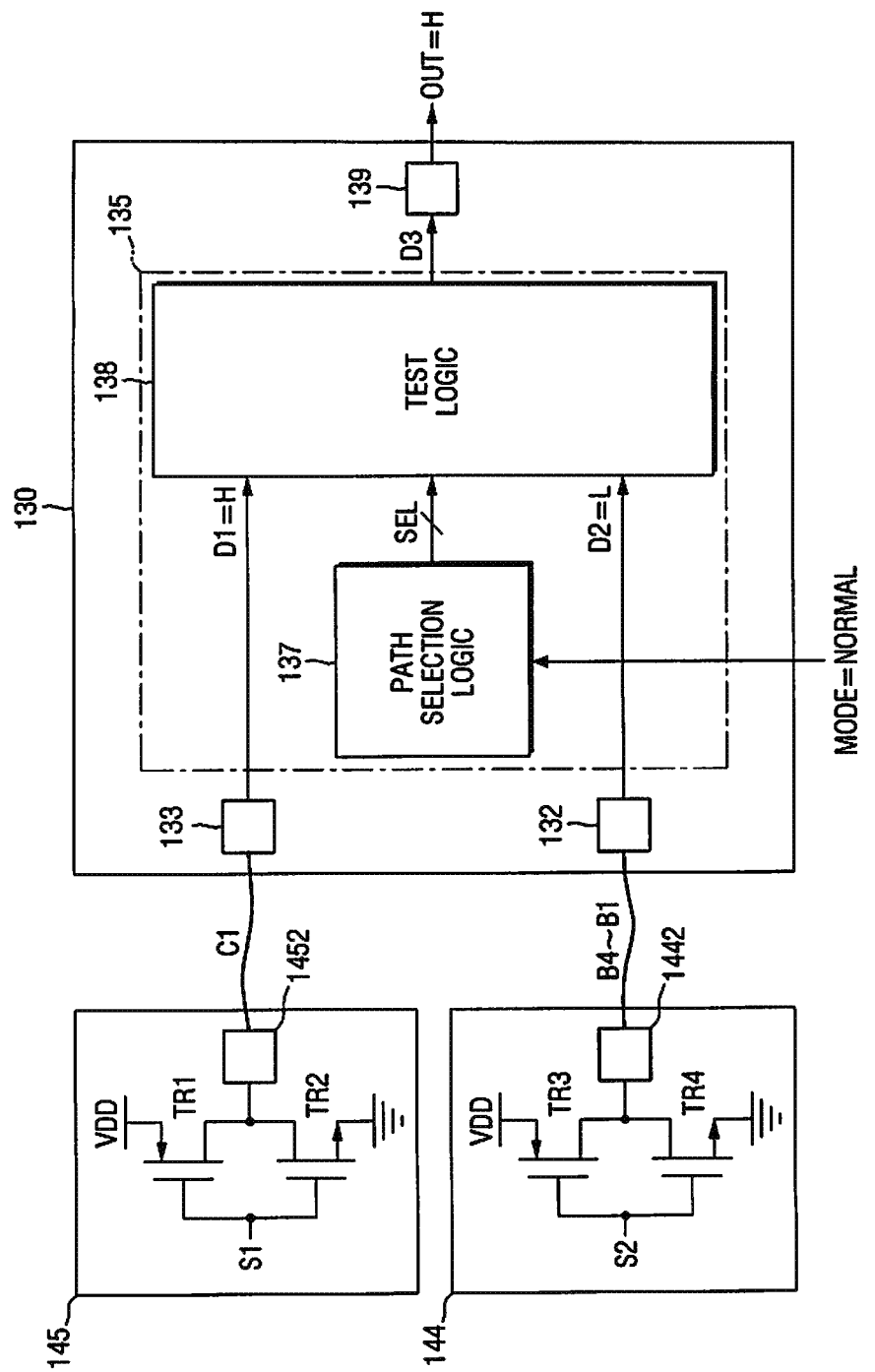
FIG. 2 is a block diagram illustrating an operation in a normal mode of the multi-chip package of FIG. 1.
Figure 3:
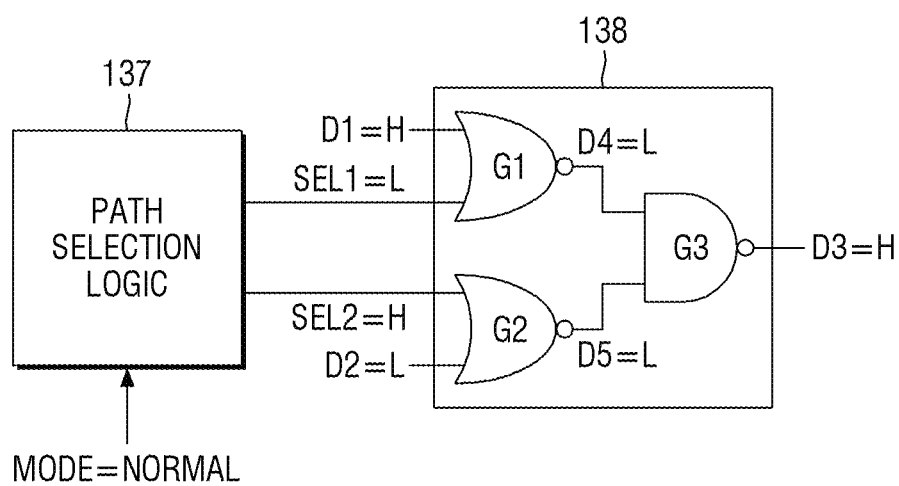
FIG. 3 is a diagram illustrating an example embodiment of an interface circuit 135 of the multi-chip package of FIG. 2.

FIG. 2 is a block diagram illustrating an operation in a normal mode of the multi-chip package of FIG. 1. Further, FIG. 3 is a diagram illustrating an example embodiment of an interface circuit 135 of the multi-chip package of FIG. 2.

First, referring to FIG. 2, the multi-chip package 1 of FIG. 1 may operate in the normal mode. The normal mode is an operation mode of the multi-chip package 1 distinguished from a test mode to be described later, and the memory controller 130 of the multi-chip package 1 of the present disclosure may read data stored in the memory chips 144 and 145 or may record the data in the memory chips 144 and 145 in the normal mode.

First, the memory chip 145 includes an output driver that outputs data to a bonding pad 1452. An output driver of the memory chip 145 may include drive transistors TR1 and TR2 connected in series with each other and gated by a signal S1. Here, the drive transistor TR1 may provide a power supply voltage VDD to the bonding pad 1452, and the drive transistor TR2 may provide a ground voltage to the bonding pad 1452.

The bonding pad 1452 is electrically connected to the bonding pad 133 of the memory controller 130 via the bonding wire C1. As a result, the memory controller 130 may receive the data D1 that is read from the memory chip 145, through the bonding pad 133.

On the other hand, the memory chip 144 includes an output driver that outputs data to the bonding pad 1442. The output driver of the memory chip 144 may include drive transistors TR3 and TR4 connected in series to each other and gated by a signal S2. Here, the drive transistor TR3 may provide the power supply voltage VDD to the bonding pad 1442, and the drive transistor TR4 may provide the ground voltage to the bonding pad 1442.

The bonding pad 1442 is electrically connected to the bonding pad 132 of the memory controller 130 via the bonding wires B4 to B1. As a result, the memory controller 130 may receive the data D2, which is read from the memory chip 144, through the bonding pad 132.

In this example embodiment, the memory controller 130 includes the aforementioned bonding pads 132 and 133, and the bonding pad 139 electrically connected to the external terminal 110 of FIG. 1 via the bonding wire A1. In addition, the memory controller 130 includes an interface circuit 135 arranged between the bonding pads 132 and 133 and the bonding pad 139.

The interface circuit 135 may receive input of data D1 read from the memory chip 145 through the bonding pad 133, and data D2 read from the memory chip 144 via the bonding pad D2. Further, the interface circuit 135 may output one of the data D1 and D2 to the external terminal 110 via the bonding pad 139 in the normal mode.

Specifically, in the present example embodiment, the interface circuit 135 includes a path selection logic 137 and a test logic 138.

The path selection logic 137 may operate in the normal mode or the test mode. For example, the path selection logic 137 may be provided with setting values for setting the operation mode from the outside, as indicated by "MODE=NORMAL" in FIG. 2 and "MODE=TEST" in FIG. 4. In the normal mode, the path selection logic 137 may control the test logic 138 to output only one output of the output driver of the memory chip 145 and the output driver of the memory chip 144.

That is, the path selection logic 137 may control the test logic 138 to output only the data D1 as data D3, among data D1 having the first logic value H provided from the output driver of the memory chip 145 and data D2 having a second logic value L provided from the output driver of the memory chip 144. To this end, the path selection logic 137 may provide a selection signal SEL to the test logic 138.

Next, referring to FIG. 3, the path selection logic 137 provides a first selection signal SEL1 and a second selection signal SEL2 for controlling the test logic 138 to the test logic 138.

The test logic 138 bypasses the data selected by the path selection logic 137 in the normal mode. Nevertheless, the test logic 138 may be implemented to include a plurality of logic gates G1, G2 and G3 that exert their functions in a test mode to be described later.

Specifically, the test logic 138 may include a first logic gate G1 which receives the data D1 and the first selection signal SEL1 and executes the first logic operation to output an intermediate data D4, a second logic gate G2 which receives the data D2 and the second selection signal SEL2 and executes a second logic operation to output an intermediate data D5, and a third logic gate G3 which receives the intermediate data D4 and the intermediate data D5 and executes a third logic operation to output the data D3.

When the logic value of the first selection signal SEL1 is the first logic value H and the logic value of the second selection signal SEL2 is the second logic value L, the test logic 138 operates in the normal mode and outputs the data D1 as the data D3. FIG. 3 illustrates such a case.

Alternatively, when the logic value of the first selection signal SEL1 is the second logic value L and the logic value of the second selection signal SEL2 is the first logic value H, the test logic 138 operates in the normal mode and outputs the data D2 as the data D3.

Alternatively, when both the logic values of the first selection signal SEL1 and the second selection signal SEL2 are the second logic value L, the test logic 138 operates in the test mode.

In particular, when the test logic 138 operates in the test mode, the data D1 and the data D2 are test data and the data D3 are the detected data, and this will be described below with reference to FIG. 8.

Further, in the present example embodiment, the first logic operation and the second logic operation may include a NOR logic operation, and the third logic operation may include a NAND logic operation. However, the specific implementation of the test logic 138 is not limited to this example embodiment, and may be modified as much as necessary.

In the present example embodiment, since the path selection logic 137 operates in the normal mode, the test logic 138 bypasses the data selected by the path selection logic 137, and finally the memory controller 130 may output the values, which are read from the memory chip 144 or the memory chip 145, to the external terminal 110.

Figure 4:
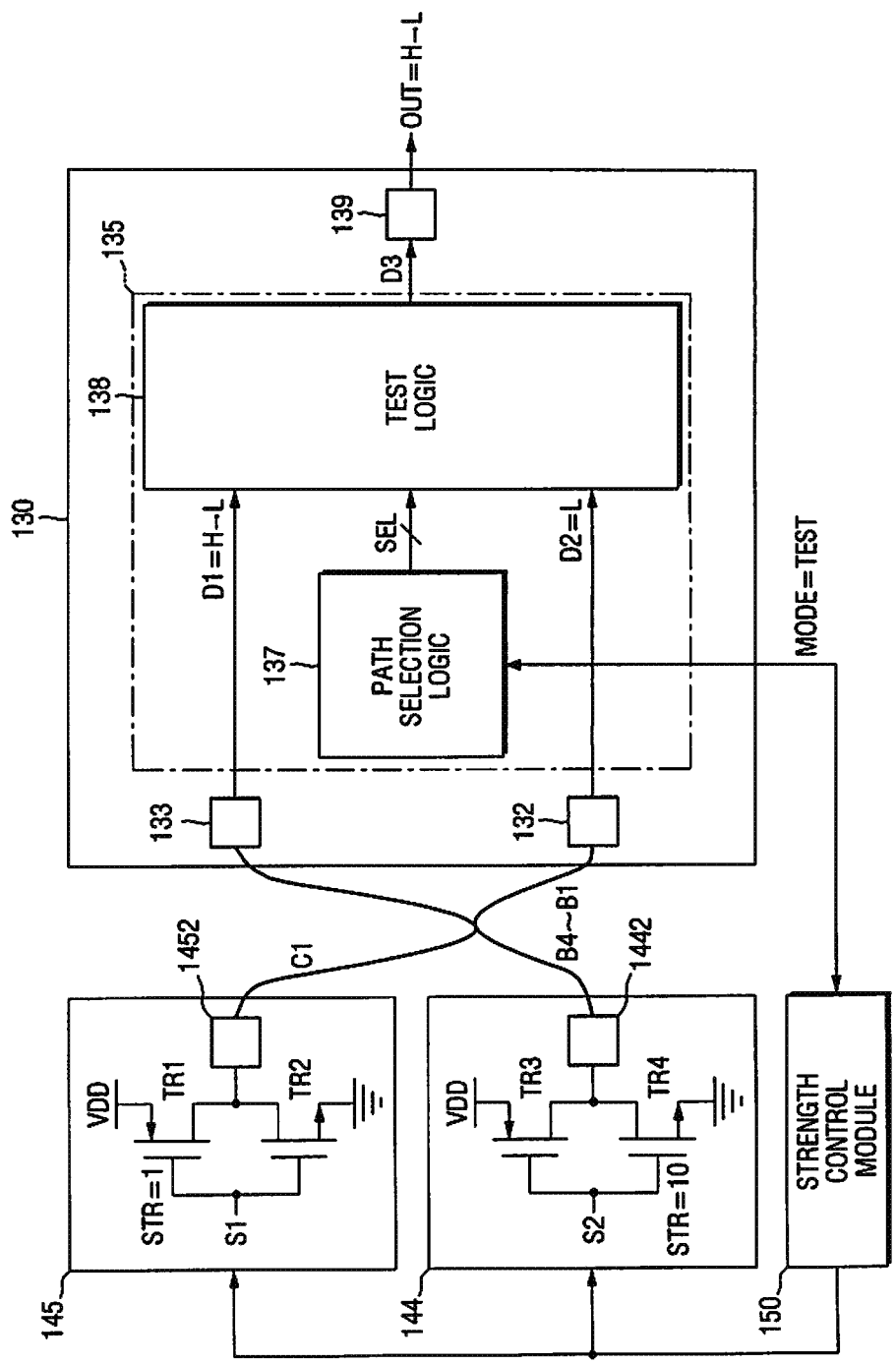
FIG. 4 is a block diagram illustrating an operation example in a test mode of the multi-chip package of FIG. 1.
Figure 5:
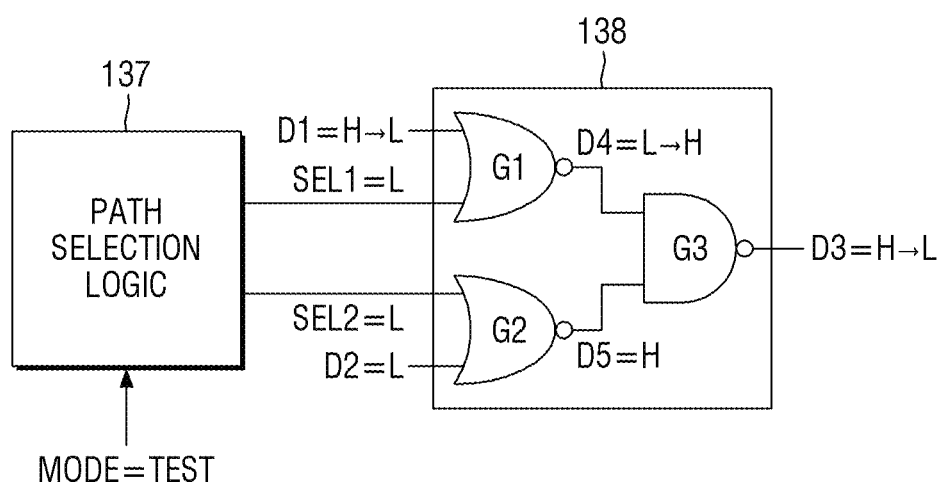
FIG. 5 is a view illustrating an operation example of the interface circuit 135 of the multi-chip package of FIG. 4.

FIG. 4 is a block diagram illustrating an operation example in the test mode of the multi-chip package of FIG. 1. Further, FIG. 5 is a diagram illustrating an operation example of the interface circuit 135 of the multi-chip package of FIG. 4.

First, referring to FIG. 4, in this example, a short circuit occurs between the bonding wire C1 and the bonding wires B4 to B1. As a result, an electrical path is formed between the bonding pad 1452 and the bonding pad 1442.

The multi-chip package 1 may operate in the test mode for detecting defects to detect such defects. To this end, the multi-chip package 1 may further include a strength control module 150. The strength control module 150 may be implemented inside the memory controller 130 or may be implemented at an arbitrary position outside the memory controller 130. In addition, the strength control module 150 may be mounted on at least one of the plurality of memory chips 141 to 148.

The strength control module 150 controls drive strength of the output driver of the memory chip 145 and the output driver of the memory chip 144, respectively. Here, the drive strength is related to the amount of load that may be driven by the drive transistor, and there is a relation in which, the amount of drivable load is large when the drive strength is high, and the amount of drivable load is small when the drive strength is low.

That is, the strength control module 150 sets the drive strength of the output driver of the memory chip 144 and the drive strength of the output driver of the memory chip 145 to be different from each other, such that the drive strength of the output driver of the memory chip 145 and the drive strength of the output driver of the memory chip 144 are mismatched.

For example, the strength control module 150 may set the drive strength of the drive transistor TR1 of the output driver of the memory chip 145 to 1, and may set the drive strength of the drive transistor TR4 of the output driver of the memory chip 144 to 10. Further, the multi-chip package 1 appropriately sets the signals S1 and S2 and turns on the drive transistor TR1 of the memory chip 145 and the drive transistor TR4 of the memory chip 144.

In a case where no short circuit occurs between the bonding wire C1 and the bonding wires B4 to B1, when the drive transistor TR1 of the memory chip 145 and the drive transistor TR4 of the memory chip 144 are turned on, the bonding pad 1452 and the bonding pad 133 have a first logic value H, and the bonding pad 1442 and the bonding pad 132L have a second logic vale L.

As the short circuit occurs between the bonding wire C1 and the bonding wires B4 to B1, and according to voltage dividing by setting the drive strength of the drive transistor TR4 to be greater than the drive strength of the drive transistor TR1, the bonding pads 1452, 1442, 133 and 132 all have the second logic value L.

That is, in the case of the first test data D1 provided to the memory controller 130 via the bonding pad 1452 and the bonding pad 133, a data flip in which the value changes from the first logic value H to the second logic value L by the strength control module 150 occurs. As a result, the value of the data output via the bonding pad 139 is also changed from the first logic value H to the second logic value L.

The strength control module 150 sets the drive strength of the output driver of the memory chip 144 and the drive strength of the output driver of the memory chip 145 to be different from each other such that data flip of the first test data D1 or the second test data D2 occurs in this way.

Then, the interface circuit 135 receives each of the first test data D1 and the second test data D2 from the output driver of the memory chip 144 and the output driver of the memory chip 145 in which the drive strength is set by the strength control module 150, and outputs detection data D3 for detecting whether the bonding wire C1 and the bonding wires B4 to B1 are short-circuited from the first test data D1 and the second test data D2.

Next, referring to FIG. 5, the path selection logic 137 may provide the test logic 138 with the first selection signal SEL1 and the second selection signal SEL2 for controlling the test logic 138 to generate detection data D3 from the first test data D1 and the second test data D2. Here, the first selection signal SEL1 and the second selection signal SEL2 may have a second logic value L.

The first logic gate G1 of the test logic 138 receives the first test data D1 and the first selection signal SEL1 and executes a first logic operation to generate intermediate data D4, and the second logic gate G2 receives the second test data D2 and the second selection signal SEL2 and executes the second logic operation to output the intermediate data D5. Further, the third logic gate G3 receives the intermediate data D4 and the intermediate data D5 and executes a third logic operation to output the detection data D3.

Here, the detection data D3 includes a first logic value H when no short circuit occurs between the first bonding wire C1 and the bonding wires B4 to B1, and the detection data D3 includes the second logic value L different from the first logic value H and when a short circuit occurs between the bonding wire C1 and the bonding wires B4 to B1.

That is, in the present example embodiment, the first test data D1 is flipped from the first logic value H to the second logic value L, the value of the intermediate data D4 is also flipped from the second logic value L to the first logic value H, and thus, the detection data D3 is also flipped from the first logic value H to the second logic value L.

That is, the strength control module 150 sets the drive strength of the drive transistor TR4 of the output driver of the memory chip 144 to be greater than the drive strength of the drive transistor TR1 of the output driver of the memory chip 145, thereby inducing the data flip.

Since the detection data D3 determined in this manner is output via the external terminal 110, it is possible to accurately detect defects such as a short-circuit that may occur in the multi-chip package 1, by analyzing the detection data D3.

Figure 6:
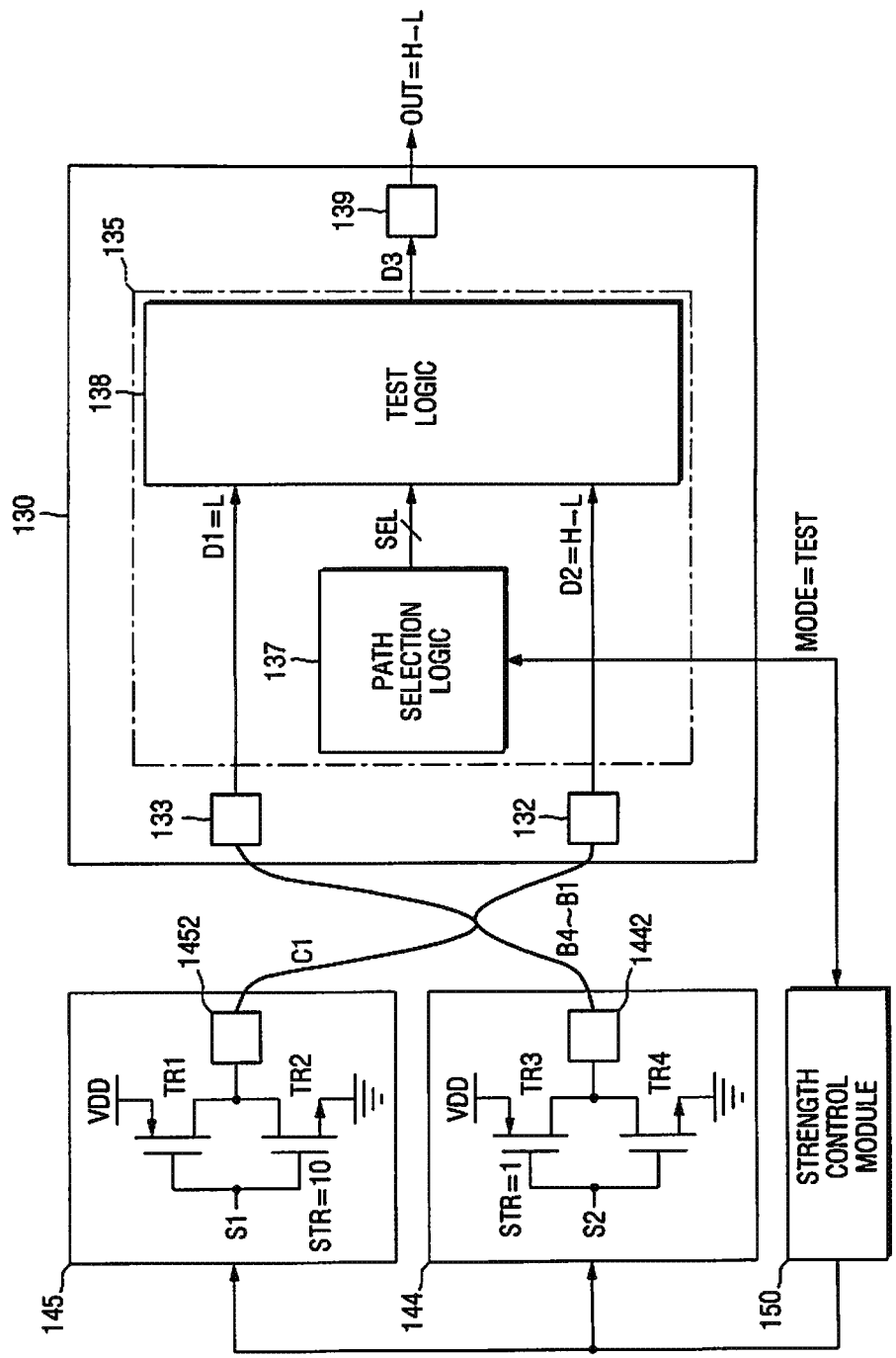
FIG. 6 is a block diagram illustrating an operation example in the test mode of the multi-chip package of FIG. 1.
Figure 7:
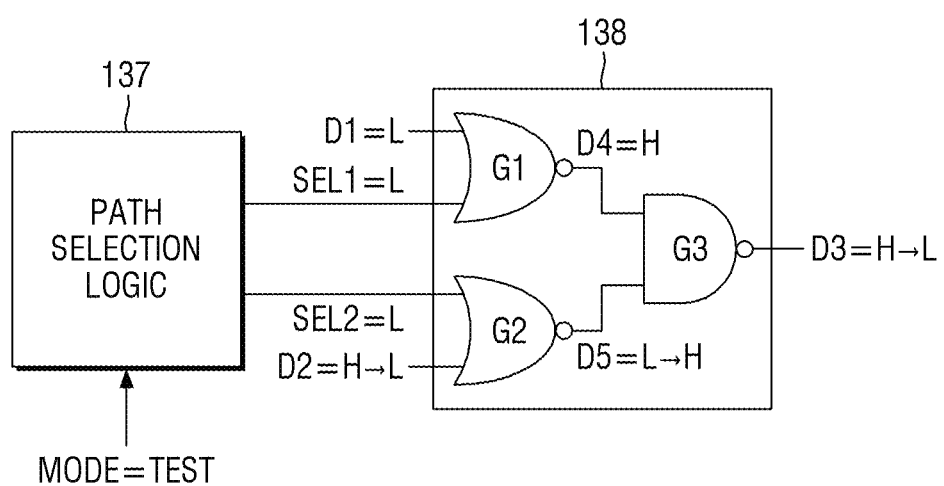
FIG. 7 is a diagram illustrating an operation example of the interface circuit 135 of the multi-chip package of FIG. 6.

FIG. 6 is a block diagram illustrating an operation example in the test mode of the multi-chip package of FIG. 1. FIG. 7 is a diagram illustrating an operation example of the interface circuit 135 of the multi-chip package of FIG. 6.

First, referring to FIG. 6, in the same manner as in the preceding example, a short circuit occurred between the bonding wire C1 and the bonding wires B4 to B1. As a result, an electrical path is formed between the bonding pad 1452 and the bonding pad 1442.

In the present example embodiment, the strength control module 150 may set the drive strength of the drive transistor TR3 of the output driver of the memory chip 144 to 1, and may set the drive strength of the drive transistor TR2 of the output driver of the memory chip 145 to 10. Further, the multi-chip package 1 appropriately sets the signals S1 and S2 to turn on the drive transistor TR2 of the memory chip 145 and the drive transistor TR3 of the memory chip 144.

In a case where the short circuit does not occur between the bonding wire C1 and the bonding wires B4 to B1, when the drive transistor TR2 of the memory chip 145 and the drive transistor TR3 of the memory chip 144 are turned on, the bonding pad 1452 and the bonding pad 133 have the second logic value L, and the bonding pad 1442 and the bonding pad 132 have the first logic value H.

As a short circuit occurs between the bonding wire C1 and the bonding wires B4 to B1, and according to the voltage dividing by setting the drive strength of the drive transistor TR2 to be greater than the drive strength of the drive transistor TR3, the bonding pads 1452, 1442, 133 and 132 all have the second logic value L.

That is, in the case of the second test data D2 provided to the memory controller 130 via the bonding pad 1442 and the bonding pad 132, a data flip in which the value is changed from the first logic value H to the second logic value L by the strength control module 150 occurs. As a result, the value of the data output through the bonding pad 139 is also changed from the first logic value H to the second logic value L.

Next, referring to FIG. 7, here, the detection data D3 includes the first logic value H when no short circuit between the first bonding wire C1 and the bonding wires B4 to B1 occurs, and the detection data D3 includes the second logic value L different from the first logic value H when a short circuit between the first bonding wire C1 and the bonding wires B4 to B1 occurs.

That is, in the present example embodiment, the second test data D2 is flipped from the first logic value H to the second logic value L, the value of the intermediate data D5 is also flipped from the second logic value L to the first logic value H, and thus, the detection data D3 is also flipped from the first logic value H to the second logic value L.

That is, the strength control module 150 sets the drive strength of the drive transistor TR3 of the output driver of the memory chip 144 to be smaller than the drive strength of the drive transistor TR2 of the output driver of the memory chip 145, thereby inducing the data flip.

Since the detection data D3 determined in this manner is output through the external terminal 110, it is possible to accurately detect defects such as a short circuit that may occur inside the multi-chip package 1, by analyzing the detection data D3.

FIG. 8 is a table illustrating the operation of the multi-chip package of FIG. 1.

Referring to FIG. 8, case '1' corresponds to the example embodiment described with reference to FIGS. 4 and 5, and case '2' corresponds to the example embodiment described with reference to FIGS. 6 and 7.

In case "1", when the drive strength of the drive transistor TR1 of the memory chip 145 is set to be weak in a channel #0 between the memory chip 145 and the memory controller 130, and the drive strength of the drive transistor TR4 of the memory chip 144 is set to be strong in a channel #1 between the memory chip 144 and the memory controller 130, if there is a defect of short circuit, since the test data D1 is flipped from the first logic value H, the detection data D3 has the second logic value L.

In case "2", when the drive strength of the drive transistor TR2 of the memory chip 145 is set to be strong in the channel #0 between the memory chip 145 and the memory controller 130, and the drive strength of the drive transistor TR3 of the memory chip 144 is set to be weak in the channel #1 between the memory chip 144 and the memory controller 130, if there is a defect of short circuit, since the test data D2 is flipped from the first logic value H, the detection data D3 has the second logic value L.

Since the detection data D3 determined in this manner is output through the external terminal 110, it is possible to accurately detect defects such as a short circuit that may occur in the multi-chip package 1, by analyzing the detection data D3.

Figure 9:
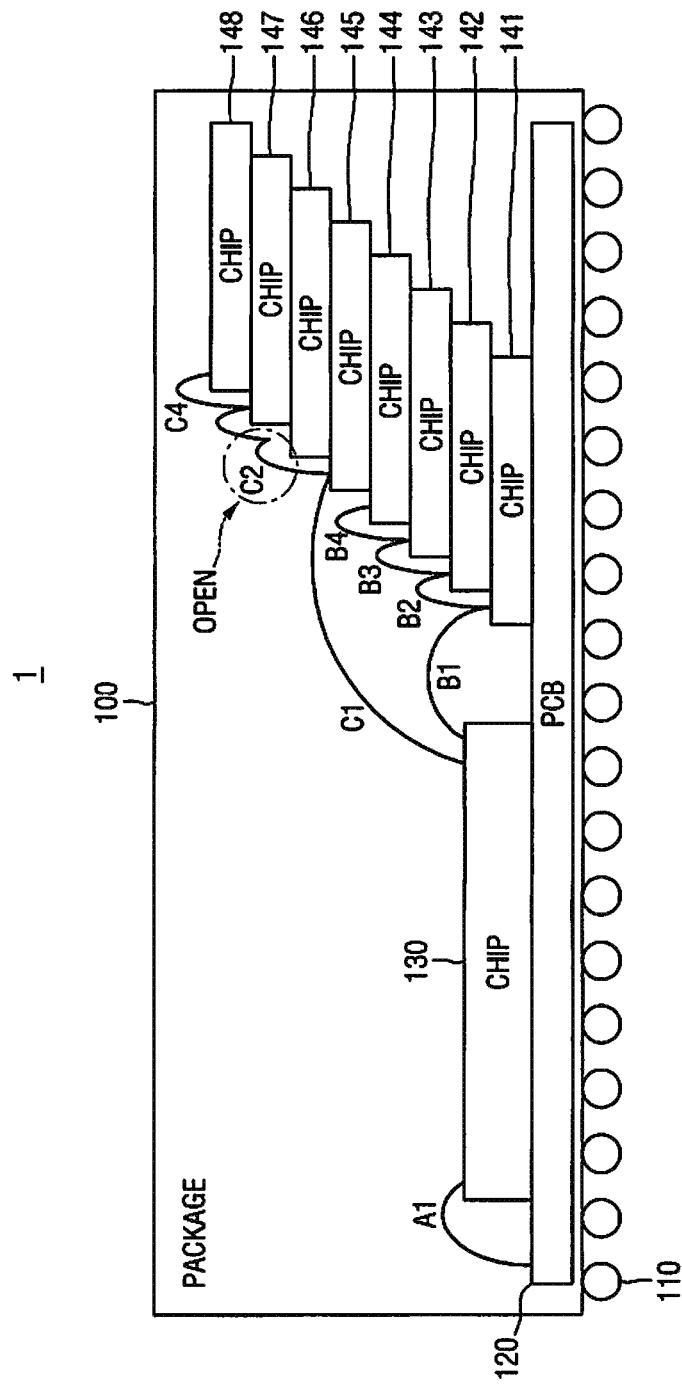
FIG. 9 is a cross-sectional view illustrating a multi-chip package according to an example embodiment of the present disclosure.

FIG. 9 is a cross-sectional view illustrating a multi-chip package according to an example embodiment of the present disclosure.

Referring to FIG. 9, the multi-chip package 1 includes a package 100 and an external terminal 110. Further, the package 100 includes a memory controller 130 and a plurality of memory chips 141 to 148 mounted on the printed circuit board 120.

The nonvolatile memory devices of the plurality of memory chips 141 to 148 may constitute a single channel controlled by the memory controller 130. In some example embodiments of the present disclosure, the nonvolatile memory devices operating independently of each other may constitute a single channel. For example, the plurality of memory chips 141 to 144 constitute a first channel, and the plurality of memory chips 145 to 148 may constitute a second channel.

The plurality of memory chips 141 to 144 may be electrically connected to the memory controller 130 through the bonding wires B1 to B4. The bonding wires B1 to B4 may transmit commands, addresses, and data, which are provided from the memory controller 130, to the plurality of memory chips 141 to 144. The bonding wires B1 to B4 may constitute the signal lines of the channel.

For example, the bonding wire B1 may be connected between the memory controller 130 and the memory chip 141, the bonding wire B2 may be connected between the memory chip 141 and the memory chip 142, the bonding wire B3 may be connected between the memory chip 142 and the memory chip 143, and the bonding wire B4 may be connected between the memory chip 143 and the memory chip 144.

The plurality of memory chips 145 to 148 may be electrically connected to the memory controller 130 via the bonding wires C1 to C4. The bonding wires C1 to C4 may transmit commands, addresses, and data, which are provided from the memory controller 130, to the plurality of memory chips 145 to 148. The bonding wires C1 to C4 may constitute the signal lines of the channel.

For example, the bonding wire C1 may be connected between the memory controller 130 and the memory chip 145, the bonding wire C2 may be connected between the memory chip 145 and the memory chip 146, the bonding wire C3 may be connected between the memory chip 146 and the memory chip 147, and the bonding wire C4 may be connected between the memory chip 147 and the memory chip 148.

In this example embodiment, the memory chip 146 of the multi-chip package 1 is not connected to the bonding wire. In other words, this is a case where the channel formed between the memory controller 130 and the memory chip 146 is opened.

Figure 10:
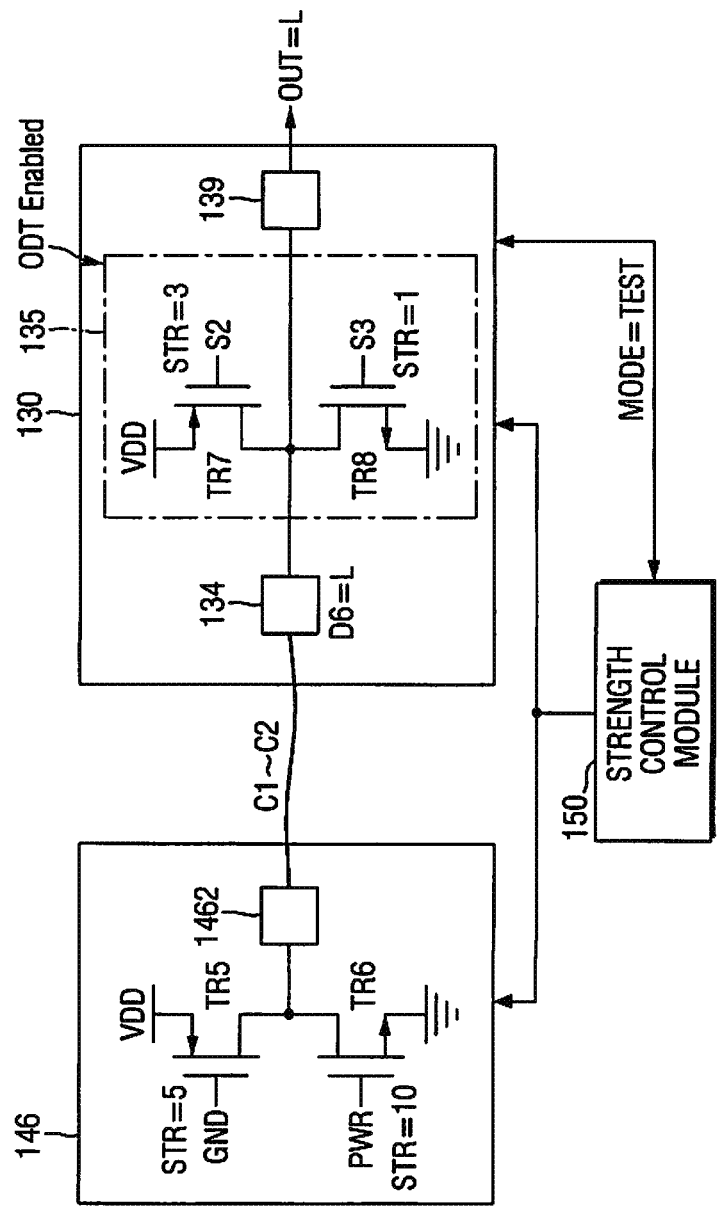
FIG. 10 is a block diagram illustrating the multi-chip package of FIG. 9.

FIG. 10 is a block diagram illustrating the multi-chip package of FIG. 9. Further, FIG. 11 is a block diagram illustrating an operation example in the test mode of the multi-chip package of FIG. 9.

Figure 11:
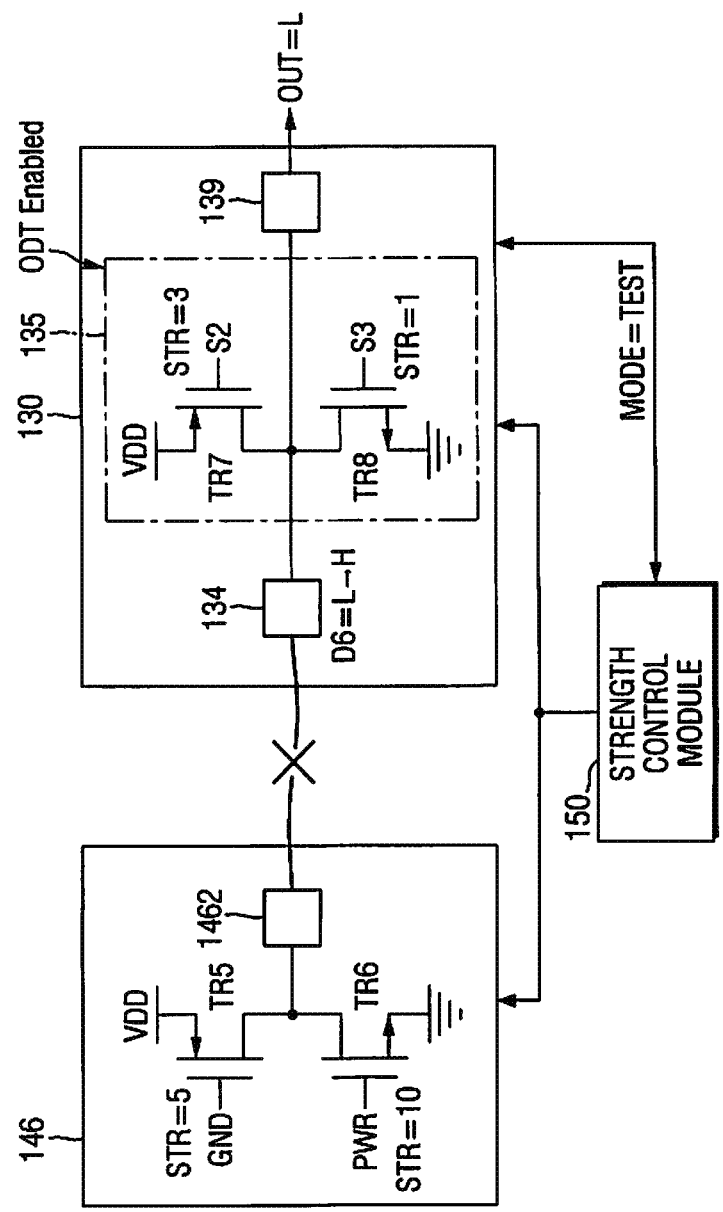
FIG. 11 is a block diagram illustrating an operation example in the test mode of the multi-chip package of FIG. 9.

Referring to FIGS. 10 and 11 together, in the present example embodiment, the interface circuit 135 supports an ODT (On Die Termination). The ODT is a technique for making a termination resistor for impedance matching of the transmission line be located inside the semiconductor chip. Since this technique is a well-known technique, detailed description thereof will not be provided in this specification.

In this example embodiment, the multi-chip package 1 may further include a strength control module 150. The strength control module 150 may be implemented inside the memory controller 130 or may be implemented at an arbitrary position outside the memory controller 130. In addition, the strength control module 150 may be mounted on at least one of the plurality of memory chips 141 to 148.

The strength control module 150 controls the output driver of the memory chip 146 and the drive strength of the interface circuit 135, respectively. Here, the drive strength is related to an amount of load that may be driven by the drive transistor, and there is a relation in which the amount of drivable load is large when the drive strength is high, and the amount of drivable load is small when the drive strength is low.

Specifically, the strength control module 150 sets the drive strength of the output driver of the memory chip 146 and the drive strength of the interface circuit 135 so that the data flip of the data output from the output driver of the memory chip 146 occurs.

For example, the output driver of the memory chip 146 includes a drive transistor TR5 which provides a power supply voltage VDD, and a drive transistor TR6 which provides a ground voltage. Further, the interface circuit 135 includes a drive transistor TR7 which provides a power supply voltage VDD, and a drive transistor TR8 which provides a ground voltage.

In this case, the strength control module 150 sets the drive strength of the drive transistor TR8 to be smaller than the drive strength of the drive transistor TR7. Further, the drive strength of the drive transistor TR6 is set to be greater than the drive strength of the drive transistor TR7.

In the present example embodiment, since the strength control module 150 sets the drive strength of the drive transistor TR7 to 3 and sets the drive strength of the drive transistor TR8 to 1, the drive strength of the drive transistor TR8 is smaller than the drive strength of the drive transistor TR7.

Further, in the present example embodiment, since the strength control module 150 sets the drive strength of the drive transistor TR6 to 10, the drive strength of the drive transistor TR6 is greater than the drive strength of the drive transistor TR7.

Further, the strength control module 150 sets the drive strength of the drive transistor TR5 to 5.

When an open channel between the memory chip 146 and the interface circuit 135 does not occur, the value output from the memory chip 146 is transmitted to the bonding pad 134 and is output through the bonding pad 139. In this case, since the drive strength of the drive transistor TR5 is 5 and the drive strength of the drive transistor TR6 is 10, the bonding pad 134 needs to have the second logic value L according to the voltage dividing.

However, as illustrated in FIG. 11, when an open channel between the memory chip 146 and the interface circuit 135 occurs, since the drive strength of the drive transistor TR7 is 3 and the drive strength of the drive transistor TR8 is 1, the bonding pad 134 is flipped from the second logic value L to the first logic value H in accordance with the voltage dividing.

That is, the interface circuit 135 may output the detection data D6 for detecting whether an open channel between the memory chip 146 and the interface circuit 135 occurs, using the output driver of the memory chip 146 and the interface circuit 135 in which the drive strength is set by the strength control module 150.

Here, the detection data D6 includes the second logic value L when no open o channel between the memory chip 146 and the interface circuit 135 occurs, and the detection data D6 may include the first logic value H different from the second logic value L when the open channel between the memory chip 146 and the interface circuit 135 occurs.

By analyzing the detection data D6 thus determined, it is possible to accurately detect the defect such as the opening which may occur inside the multi-chip package 1.

Figure 12:
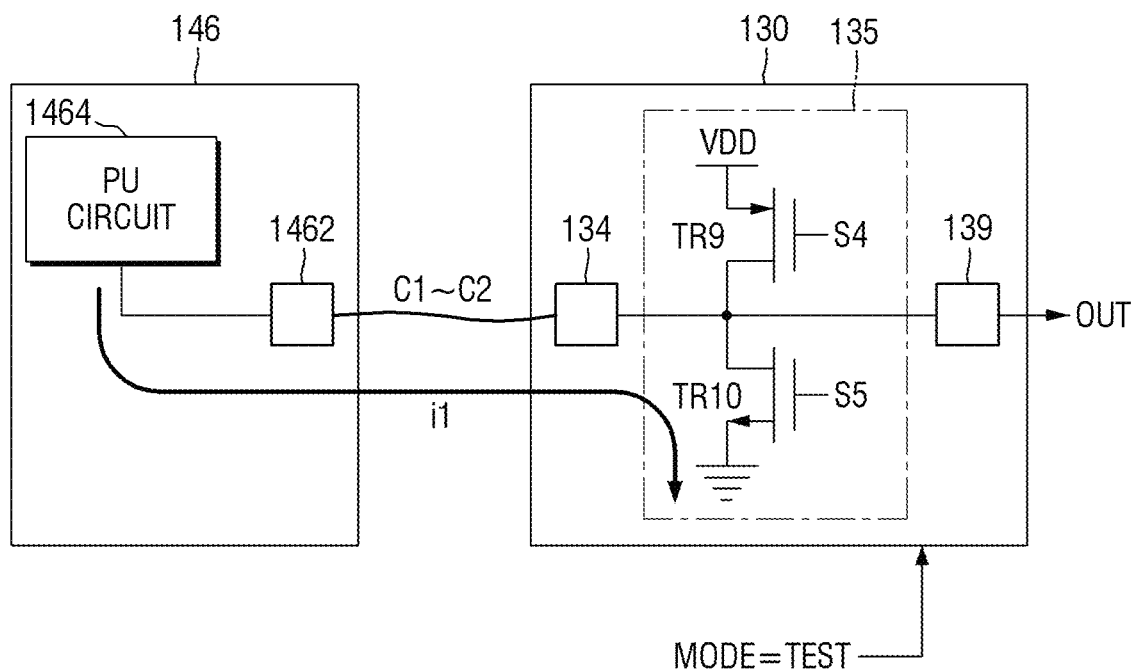
FIG. 12 is a block diagram illustrating a multi-chip package according to an example embodiment of the present disclosure.
Figure 13:
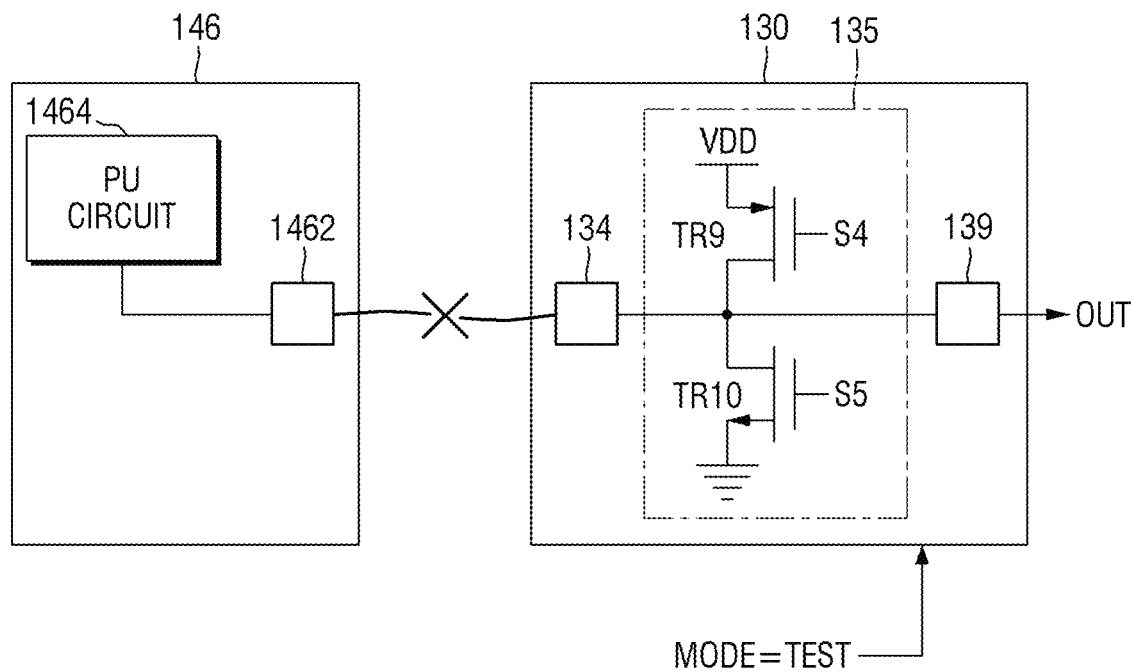
FIG. 13 is a block diagram illustrating an operation example in the test mode of the multi-chip package of FIG. 12.

FIG. 12 is a block diagram illustrating a multi-chip package according to an example embodiment of the present disclosure. FIG. 13 is a block diagram illustrating an operation example in the test mode of the multi-chip package of FIG. 12.

Referring to FIG. 12, the interface circuit 135 includes a drive transistor TR9 which provides a power supply voltage VDD to the memory chip 146, and a drive transistor TR10 which provides a ground voltage to the memory chip 146. In the present example embodiment, it is possible to detect whether the channel between the memory chip 146 and the memory controller 130 is opened, using the drive transistor TR9 and the drive transistor TR10.

In this example embodiment, the memory chip 146 further includes a bonding pad 1462 electrically connected to the bonding wires C1 to C2, and a pull-up circuit 1464 electrically connected to the bonding pad 1462 to pull up the bonding pad 1462. Here, the configuration of the pull-up circuit 1464 is not limited to a specific circuit, and may be implemented as an arbitrary circuit that pulls up a voltage level of the bonding pad 1462. Further, the pull-up circuit 1464 may be implemented inside the memory chip 146 or may be implemented outside the memory chip 146.

In the test mode, the pull-up circuit 1464 of the memory chip 146, and the drive transistor TR10 of the interface circuit may be turned on.

As illustrated in FIG. 12, when the open channel between the memory chip 146 and the memory controller 130 does not occur, the amount of current flowing through the drive transistor TR10 increases. As illustrated in FIG. 13, when the open channel between the memory chip 146 and the memory controller 130 occurs, the amount of current flowing through the drive transistor TR10 does not increase.

Therefore, in the present example embodiment, it is possible to detect whether the channel between the memory chip 146 and the memory controller 130 is opened by monitoring the change in the amount of current flowing through the drive transistor TR10.

Figure 14:
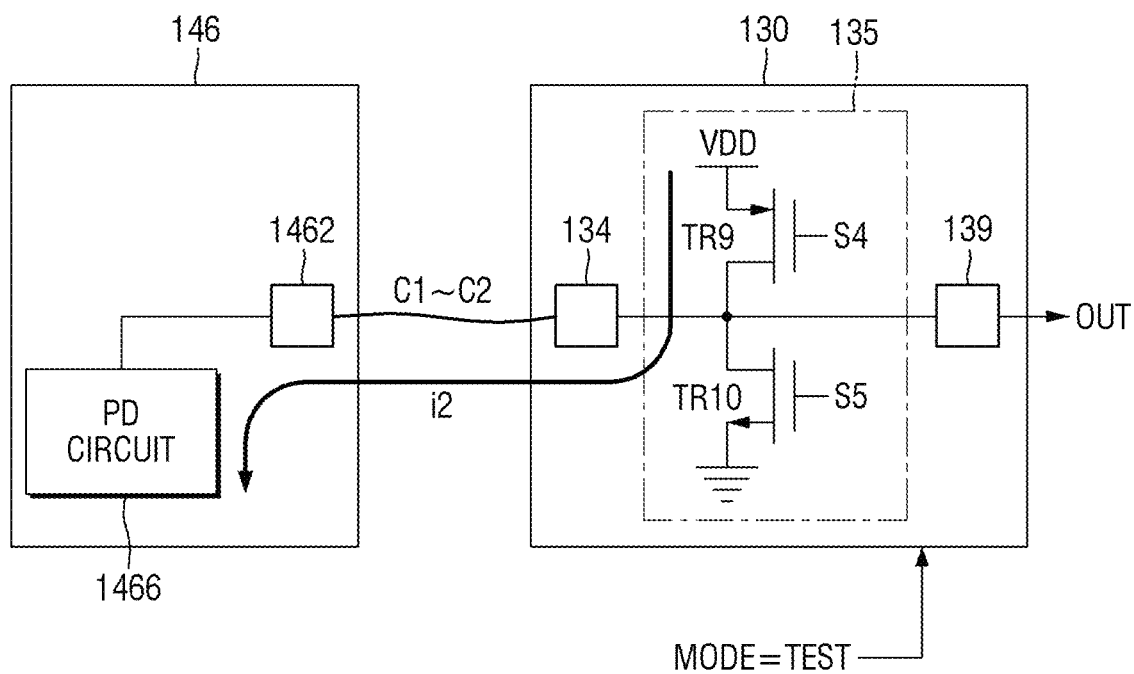
FIG. 14 is a block diagram illustrating a multi-chip package according to an example embodiment of the present disclosure.
Figure 15:
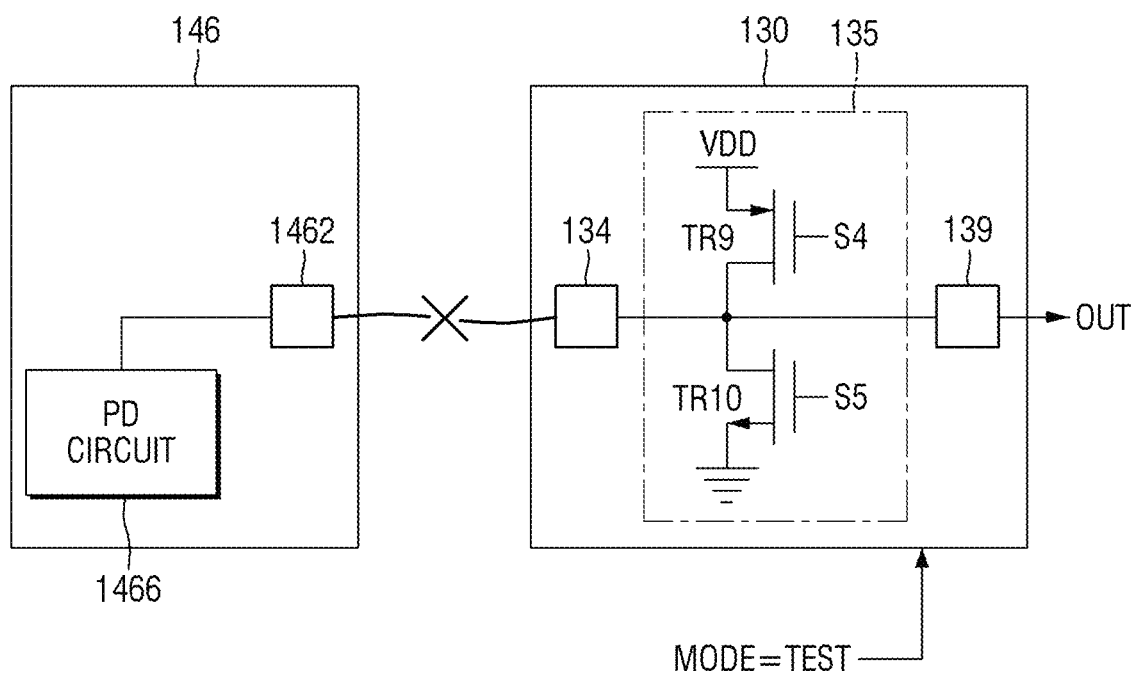
FIG. 15 is a block diagram illustrating an operation example in the test mode of the multi-chip package of FIG. 14.

FIG. 14 is a block diagram illustrating a multi-chip package according to an example embodiment of the present disclosure. FIG. 15 is a block diagram illustrating an operation example in the test mode of the multi-chip package of FIG. 14.

Referring to FIG. 14, the interface circuit 135 includes a drive transistor TR9 which provides a power supply voltage VDD to the memory chip 146, and a drive transistor TR10 which provides a ground voltage to the memory chip 146. Also in the present example embodiment, it is possible to detect whether the channel between the memory chip 146 and the memory controller 130 is opened, using the drive transistor TR9 and the drive transistor TR10.

In this example embodiment, the memory chip 146 further includes a bonding pad 1462 electrically connected to the bonding wires C1 to C2, and a pull-down circuit 1466 electrically connected to the bonding pad 1462 to pull down the bonding pad 1462. Here, the configuration of the pull-down circuit 1466 is not limited to a specific circuit, and may be implemented as an arbitrary circuit that pulls down the voltage level of the bonding pad 1462. Further, the pull-down circuit 1466 may be implemented inside the memory chip 146 or may be implemented outside the memory chip 146.

In the test mode, the pull-down circuit 1466 of the memory chip 146 and the drive transistor TR9 of the interface circuit may be turned on.

As illustrated in FIG. 14, when the open channel between the memory chip 146 and the memory controller 130 does not occur, the amount of current flowing through the drive transistor TR9 increases. As illustrated in FIG. 15, when the open channel between the memory chip 146 and the memory controller 130 occurs, the amount of current flowing through the drive transistor TR9 does not increase.

Therefore, in the present example embodiment, it is possible to detect whether the channel between the memory chip 146 and the memory controller 130 is opened, by monitoring the change in the amount of current flowing through the drive transistor TR9.

According to various example embodiments of the present disclosure described thus far, it is possible to accurately detect defects such as short-circuit and opening which may occur inside the multi-chip package.

In concluding the detailed description, those skilled in the art will appreciate that many variations and modifications may be made to the example embodiments without substantially departing from the principles of the present disclosure. Therefore, the disclosed example embodiments of the disclosure are used in a generic and descriptive sense only and not for purposes of limitation.

What is claimed is:

1. A multi-chip package comprising:
a first memory chip and a second memory chip on a printed circuit board;
a memory controller electrically connected to the first memory chip and the second memory chip via a first bonding wire and a second bonding wire; and
a strength control module configured to control a drive strength of each of a first output driver of the first memory chip and a second output driver of the second memory chip,
wherein the memory controller includes an interface circuit configured to
receive each of first test data and second test data from the first output driver and the second output driver in which the drive strength is set by the strength control module, and
output detection data for detecting whether the first bonding wire and the second bonding wire are short-circuited based on the first and second test data.

2. The multi-chip package of claim 1, wherein the strength control module is configured to set the drive strength of the first output driver and the drive strength of the second output driver to be different from each.

3. The multi-chip package of claim 2, wherein the strength control module is configured to set the drive strength of the first output driver and the drive strength of the second output driver to be different from each other such that a data flip of the first test data or the second test data occurs.

4. The multi-chip package of claim 3, wherein the strength control module is configured to set the drive strength of a drive transistor of the second output driver to be greater than the drive strength of a drive transistor of the first output driver.

5. The multi-chip package of claim 3, wherein the strength control module is configured to set the drive strength of a drive transistor of the second output driver to be smaller than the drive strength of a drive transistor of the first output driver.

6. The multi-chip package of claim 1, wherein the interface circuit includes a path selection logic and a test logic, and
based on operating in a test mode, the path selection logic is configured to control the test logic to generate the detection data from the first test data and the second test data.

7. The multi-chip package of claim 6, wherein based on operating in a normal mode, the path selection logic is configured to control the test logic to select only one output of the first output driver and the second output driver.

8. The multi-chip package of claim 6, wherein the path selection logic is configured to provide the test logic with a first selection signal and a second selection signal for controlling the test logic, and the test logic includes
a first logic gate configured to receive the first test data and the first selection signal and perform a first logic operation to output first intermediate data,
a second logic gate configured to receive the second test data and the second selection signal and perform a second logic operation to output second intermediate data, and
a third logic gate configured to receive the first intermediate data and the second intermediate data and perform a third logic operation to output the detection data.

9. The multi-chip package of claim 8, wherein the test logic outputs the detection data to an external terminal through a bonding pad.

10. The multi-chip package of claim 8, wherein the detection data includes
a first logic value based on no short circuit between the first bonding wire and the bonding wire occurring, and
a second logic value different from the first logic value based on a short circuit between the first bonding wire and the bonding wire occurring.

11. A multi-chip package comprising:
a memory chip on a printed circuit board;
a memory controller electrically connected to the memory chip through a bonding wire and including an interface circuit for driving the memory chip; and
a strength control module configured to respectively control drive strengths of output drivers of the memory chip and the interface circuit,
wherein the interface circuit is configured to output, using the output drivers of the memory chip and the interface circuit, detection data for detecting whether an open channel between the memory chip and the interface circuit exists.

12. The multi-chip package of claim 11, wherein the strength control module is configured to respectively set the drive strengths of the output drivers of the memory chip and the drive strength of the interface circuit so that a data flip of the data output from the interface circuit occurs.

13. The multi-chip package of claim 12, wherein
the interface circuit includes a first drive transistor configured to provide a power supply voltage, and a second drive transistor configured to provide a ground voltage, and
the strength control module is configured to set the drive strength of the second drive transistor to be smaller than the drive strength of the first drive transistor.

14. The multi-chip package of claim 13, wherein the strength control module is configured to set the drive strength of a third drive transistor of the memory chip to be greater than the drive strength of the first drive transistor.

15. The multi-chip package of claim 11, wherein the detection data includes a first logic value based on no open channel between the memory chip and the interface circuit existing, and includes a second logic value different from the first logic value based on an open channel between the memory chip and the interface circuit existing.

16. A multi-chip package comprising:
a memory chip on a printed circuit board; and
a memory controller electrically connected to the memory chip through a bonding wire and including an interface circuit configured to drive the memory chip,
wherein the interface circuit includes
a first drive transistor configured to provide a power supply voltage to the memory chip, and
a second drive transistor configured to provide a ground voltage to the memory chip; and
the interface circuit configured to determine, using the power supply voltage of the first drive transistor and the ground voltage of the second drive transistor, whether a channel between the memory chip and the memory controller is open.

17. The multi-chip package of claim 16, wherein the memory chip comprises:
a bonding pad electrically connected to the bonding wire, and
a pull-up circuit electrically connected to the bonding pad to pull up the bonding pad.

18. The multi-chip package of claim 17, wherein, based on no open channel between the memory chip and the memory controller existing, an amount of current flowing through the second drive transistor increases, and based on an open channel between the memory chip and the memory controller existing, the amount of current flowing through the second drive transistor does not increase.

19. The multi-chip package of claim 16, wherein the memory chip comprises:
a bonding pad electrically connected to the bonding wire, and
a pull-down circuit electrically connected to the bonding pad to pull down the bonding pad.

20. The multi-chip package of claim 19, wherein, based on no open channel between the memory chip and the memory controller existing, an amount of current flowing through the first drive transistor increases, and based on an open of the channel between the memory chip and the memory controller existing, the amount of current flowing through the first drive transistor does not increase.

* * * * *